United States Patent
Arcudia et al.

(10) Patent No.: US 9,225,324 B2
(45) Date of Patent: Dec. 29, 2015

(54) CIRCUIT FOR GENERATING ACCURATE CLOCK PHASE SIGNALS FOR HIGH-SPEED SERDES

(71) Applicant: QUALCOMM Incorporated, San Diego, CA (US)

(72) Inventors: Kenneth Arcudia, Cary, NC (US); Zhiqin Chen, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 4 days.

(21) Appl. No.: 14/257,913

(22) Filed: Apr. 21, 2014

(65) Prior Publication Data

US 2015/0303909 A1    Oct. 22, 2015

(51) Int. Cl.
H03M 9/00  (2006.01)
H03K 5/156  (2006.01)
H03L 7/06  (2006.01)

(52) U.S. Cl.
CPC .............. H03K 5/1565 (2013.01); H03L 7/06 (2013.01); H03M 9/00 (2013.01)

(58) Field of Classification Search
CPC .......... H03K 5/1565; H03M 9/00; H03L 7/06
USPC ....................................................... 341/100
See application file for complete search history.

(56) References Cited

U.S. PATENT DOCUMENTS

| 6,900,681 | B2 | 5/2005 | Takano |
| 7,394,283 | B2 * | 7/2008 | Hsu et al. ................. 326/32 |
| 7,847,609 | B2 | 12/2010 | Shin |
| 7,928,765 | B2 * | 4/2011 | Hoque et al. ............. 326/66 |
| 7,936,186 | B1 * | 5/2011 | Tong et al. ............... 326/127 |
| 8,058,913 | B2 * | 11/2011 | Kim et al. ................ 327/149 |
| 8,081,024 | B1 | 12/2011 | Evans |
| 8,139,700 | B2 | 3/2012 | Beukema et al. |
| 8,749,269 | B2 * | 6/2014 | Cao .......................... 326/68 |
| 2010/0085099 | A1 | 4/2010 | Ma |
| 2013/0249612 | A1 | 9/2013 | Zerbe et al. |

FOREIGN PATENT DOCUMENTS

GB    2446511 A    8/2008

OTHER PUBLICATIONS

International Search Report and Written Opinion—PCT/US2015/019970—ISA/EPO—May 28, 2015.

* cited by examiner

*Primary Examiner* — Brian Young
(74) *Attorney, Agent, or Firm* — Procopio, Cory, Hargreaves & Savitch LLP

(57) ABSTRACT

Systems and methods for generating clock phase signals with accurate timing relations are disclosed. For example, four clock signals spaced by 90 degrees can be generating from differential CML clock signals. A CML to CMOS converter converts the differential CML clock signals to differential CMOS clock signals and provides duty cycle correction. Delay cells produce delayed clock signals from the differential CMOS clock signals. The differential CMOS clock signals and the delayed clock signals are logically combined to produce four quarter clock signals having active times of one-quarter clock period. Set-reset latches produce the four clock signals from the quarter clock signals. A calibration module control delays of the delay cells and controls the duty cycle correction of the CML to CMOS converter to adjust the timing relationships of the four clock signals. The four clock signals may be used, for example, in a deserializer.

30 Claims, 7 Drawing Sheets

CIRCUIT FOR GENERATING ACCURATE CLOCK PHASE SIGNALS FOR HIGH-SPEED SERDES

BACKGROUND

1. Field

The present invention relates to electronic circuits and, more particularly, to electronic circuits for generating accurate clock phase signals for high-speed SERDES.

2. Background

The use of high-speed serial communication links in electronic systems has continued to grow. High-speed serial communication links can operate according to various standards such as Universal Serial Bus (USB), High-Definition Multimedia Interface (HDMI), Serial Advanced Technology Attachment (SATA), and Peripheral Component Interconnect Express (PCIe) interfaces. A serializer/deserializer (SERDES) is used to transmit and receive from a serial communication link. A SERDES generally uses multiple clock signals to perform its functions. A SERDES may use, for example, four clock signals that are spaced by one-quarter of a clock period. The performance of a SERDES can be degraded if the clock signals do not have accurate relationships. For example, mismatched timing between the clock signals may cause errors in received data.

SUMMARY

In one aspect, a circuit for generating four clock signals with accurate timing relationships is provided. The circuit includes: a current-mode logic (CML) to complementary metal oxide semiconductor (CMOS) converter configured to convert a differential pair of CML clock signals to a differential pair of CMOS clock signals, wherein the CML to CMOS converter includes a duty cycle correction function that controls the duty cycle (the fraction of a clock period during which the signal is high) of the differential pair of CMOS clock signals; a delay-locked loop module configured to produce the four clock signals from the differential pair of CMOS clock signals; and a calibration module configured to control delays of the delay-locked loop module and control the duty cycle correction of the CML to CMOS converter to adjust the timing relationships of the four clock signals.

In one aspect, a method for generating four clock signals with accurate timing relationships is provided. The method includes: converting logic levels of a differential pair of CML clock signals to a differential pair of CMOS clock signals including adjusting the duty cycle of the differential pair of CMOS clock signals; delaying each of the differential pair of CMOS clock signals to produce delayed clock signals; combining the differential pair of CMOS clock signals and the delayed clock signals to produce the four clock signals; and calibrating the adjustment of the duty cycle of the differential pair of CMOS clock signals and the delay of the delayed clock signals to adjust the timing relationships of the four clock signals.

In one aspect, an apparatus for generating four clock signals with accurate timing relationships is provided. The apparatus includes: a means for converting a differential pair of CML clock signals to a differential pair of CMOS clock signals including a duty cycle correction function that controls the duty cycle of the differential pair of CMOS clock signals; a means for producing the four clock signals from the differential pair of CMOS clock signals including delaying each of the differential pair of CMOS clock signals; and a means for calibrating the timing relationships of the four clock signals including controlling the delays of delaying each of the differential pair of CMOS clock signals and controlling the duty cycle correction function.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
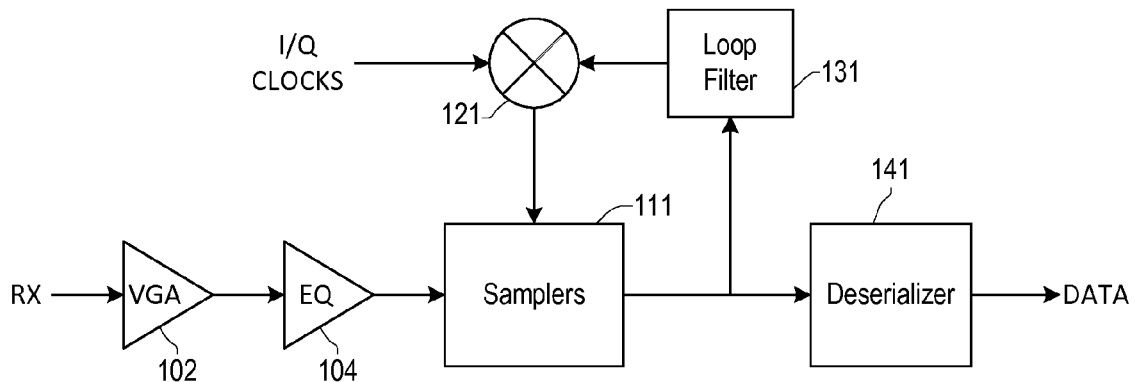
FIG. 1 is a functional block diagram of a deserializer.

FIG. 1 is a functional block diagram of a deserializer (also referred to as a clock and data recovery circuit or CDR). The deserializer is a "half-rate" design in which the frequency of clock signals used in the deserializer is one-half the data rate. The deserializer receives a serial data signal RX that contains a serial stream of data. Each bit of the serial stream of data spans a time interval that may be referred to as a bit time. The deserializer operates to recover the data from the serial data signal and recover a clock signal that indicates the timing of the data.

The deserializer includes a variable gain amplifier 102 that can adjust the amplitude of the received signal. The output of the variable gain amplifier 102 is received by an equalizer 104 that can equalize the received signal to compensate for frequency-dependent losses. A sampler module 111 samples the amplified and equalized signal at two times per bit time (four times per clock period). Timing of the samples is based on clock signals received from a phase interpolator 121.

The phase interpolator 121 produces four clock signals that are nominally spaced by 90 degrees (one-quarter clock period). The clock signals may be referred to as 0, 90, 180, 270 degree clock signals according to their relative timing. The phase interpolator 121 produces the clock signals by interpolating between in-phase and quadrature clock signals (e.g., received from a phase-locked loop). The in-phase (I) and quadrature (Q) clock signals are each differential signals with the quadrature clock signal shifted 90 degrees from the in-phase clock signal.

The deserializer uses a loop filter 131 for timing recovery. The loop filter 131 supplies digital signals that control the phase of the phase interpolator 121. The loop filter 131 operates to place the 0 and 180 degree clock signals on the centers of the bit times of the received data and the 90 and 270 degree clock signals on the edges of the bit times of the received data. The 0 degree and 180 degree clock signals can then be used to sample the received data signal to produce the recovered data. The 90 and 270 degree clock signals can also be used to sample the received data signal. All of the samples can be used by the loop filter 131 for timing recovery.

A data deserializer module 141 converts data samples from the sampler module 111 from serial to parallel format. For example, the data deserializer module 241 may combine five sets of samples of the received data signal that were sampled using the 0 degree and 180 degree clock signals to produce 10-bit parallel output (DATA).

Figure 2:
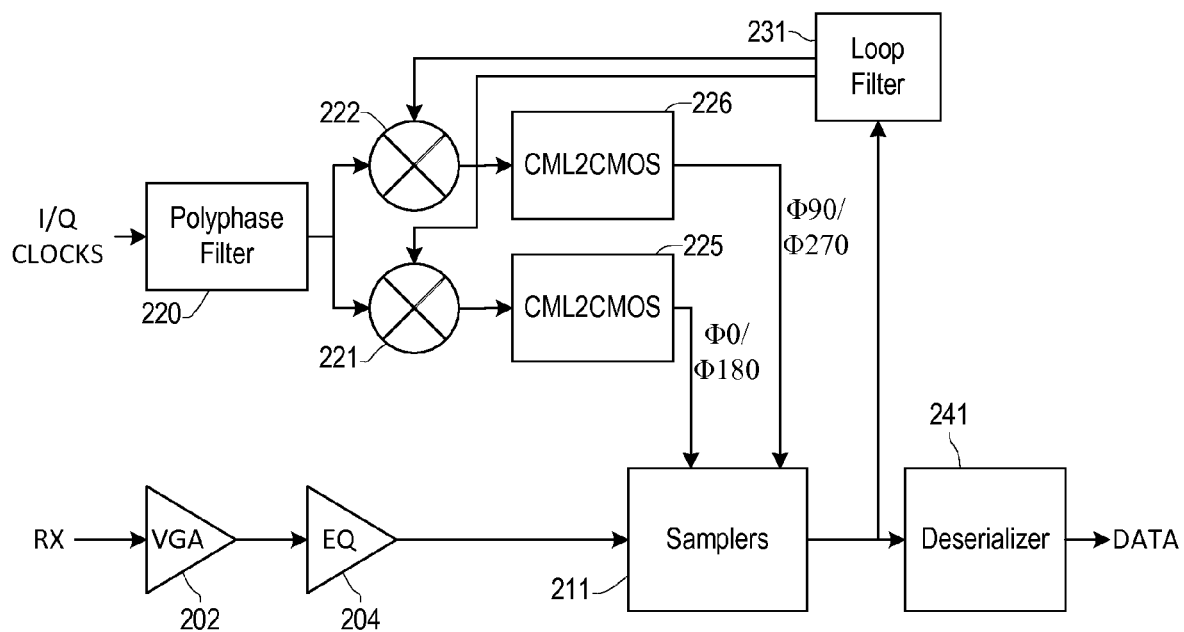
FIG. 2 is a functional block diagram of a previous deserializer.

FIG. 2 is a functional block diagram of a previous deserializer. The deserializer of FIG. 2 is similar to the deserializer of FIG. 1 with like referenced elements operating in like fashion except for described differences.

The deserializer of FIG. 2 includes a polyphase filter 220 to filter the in-phase and quadrature clock signals and improve the relative timing of the clock phases. Two phase interpolators 221, 222 interpolate signals from the polyphase filter. The phase interpolators interpolate to phases separated by 90 degrees and are controlled by a digital loop filter 231. Each phase interpolator produces a differential pair of output signals. The differential pair of output signals from the first phase interpolator 221 is used to produce the 0 degree and 180 degree clock signals. The differential pair of output signals from the second phase interpolator 222 is used to produce the 90 degree and 270 degree clock signals. The loop filter 231 and the data deserializer module 241 can operate like the loop filter 131 and the data deserializer module 141.

The polyphase filter and the phase interpolators use current-mode logic (CML). Each of the phase interpolators is followed by a CML to CMOS converter 225, 226 that converts CML clock signals from the phase interpolators to CMOS clock signals. The CML signals are differential signals with voltage swings that are less than the associated supply voltage. The CMOS signals generally have voltage swings that equal the associated supply voltage (also called rail-to-rail). The CMOS clock signals are used in sampler module 211 to sample the received data signal.

Sources of phase errors between the CMOS clock signals include mismatches in the two phase interpolators, mismatches in the in-phase and quadrature clock signals (which can be substantially reduced by the polyphase filter but only over a narrow band of frequencies), and mismatches and skews in the CML to CMOS converters. Additionally the phase interpolators and CML to CMOS converters can occupy a large amount of integrated circuit area and have high power consumption. The polyphase filter can exacerbate this by attenuating the in-phase and quadrature clock signals.

Figure 3:
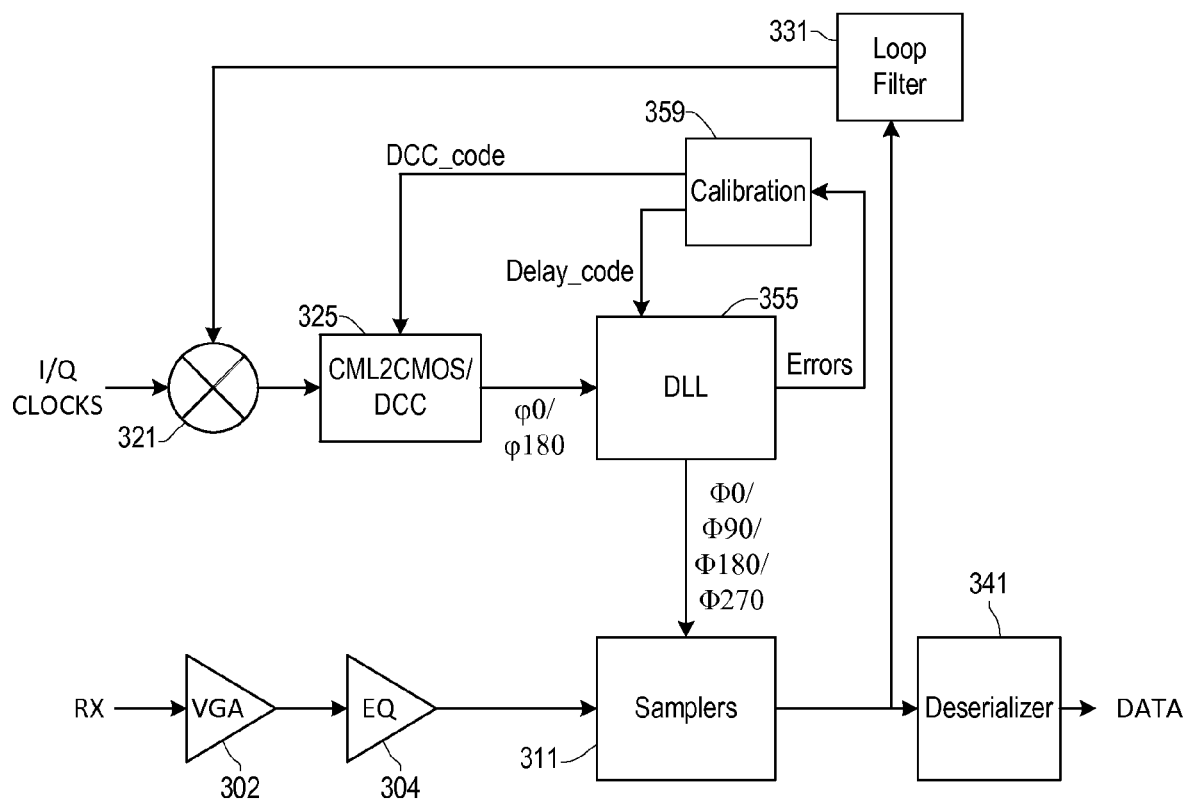
FIG. 3 is a functional block diagram of a deserializer according to a presently disclosed embodiment.

FIG. 3 is a functional block diagram of a deserializer according to a presently disclosed embodiment. The deserializer of FIG. 3 is similar to the deserializer of FIG. 1 with like referenced elements operating in like fashion except for described differences. In contrast with the deserializer of FIG. 2, the deserializer of FIG. 3 performs clock phase signal generation without using a polyphase filter and uses only one phase interpolator (and only one CML to CMOS converter).

The deserializer uses a phase interpolator 321 to produce a differential pair of CML clock signals interpolated from in-phase and quadrature clock signals. Component signals of a differential pair of signals may be termed a positive signal and a negative signal. In the embodiment of FIG. 3 there is no polyphase filter between the in-phase and quadrature clock signals and the phase interpolator, thus the deserializer can operate over a wide frequency range. The phase interpolator 321 interpolates to a phase based on a phase control signal from a loop filter 331. The phase interpolator 321 receives and produces CML signals. A CML to CMOS converter 325 converts the differential pair of CML clock signals from the phase interpolator 321 to a differential pair (complementary) of CMOS clock signals ($\phi 0$, $\phi 180$). The CML to CMOS converter 325 includes a duty cycle correction (DCC) function. The duty cycle correction function is used to adjust the differential pair of CMOS clock signals so that edges of the signals are separated by 180 degrees.

A delay-locked loop (DLL) module 355 receives the differential pair of CMOS clock signals from the CML to CMOS converter 325 and uses delay cells (or delay lines) to produce the 0, 90, 180, and 270 degree clock signals ($\Phi 0$, $\Phi 90$, $\Phi 180$, $\Phi 270$). The 0, 90, 180, and 270 degree clock signals are used for timing by the sampler module 311. Before the received data signal is sampled in the sampler module 311, it may be amplified by the variable gain amplifier 302 and equalized by the equalizer 304. After the received data signal is sampled, the data deserializer module 341 can convert the samples from serial to parallel format. Accordingly, the 0, 90, 180, and 270 degree clock signals may be referred to as sampling clock signals. The DLL module 355 also produces error signals (Errors) that indicate errors in the relative timing of the 0, 90, 180, and 270 degree clock signals.

A calibration module 359 receives the error signals from the DLL module 355. The calibration module 359 evaluates the error signals and produces control signals for the CML to CMOS converter 325 and for the DLL module 355. The DCC control signal (DCC_code) from the calibration module 359 to the CML to CMOS converter 325 is used to adjust the duty cycle correction. The delay control signal (Delay_code) to the DLL module 355 is used to adjust delays of the delay cells. In various embodiments, the calibration module 359 may produce multiple DCC control signals and may produce multiple delay control signals.

The deserializer of FIG. 3 may have several advantages over prior deserializers. The deserializer can, using the calibration module 359, improve timing of the sampling clock signals and thereby improve performance of the deserializer, for example, improving timing margins of the deserializer. The calibration module 359 may correct for mismatch between the in-phase and quadrature clock signals from the PLL, for duty-cycle errors in the clock signals from the PLL, and for circuit mismatches and variation with process, voltage, and temperature. The absence of a polyphase filter in the deserializer of FIG. 3 may allow the deserializer to operate over a wide range of data rates.

Additionally, the deserializer of FIG. 3 also can occupy less integrated circuit area and consume less power than the prior deserializer. Furthermore, the calibration module 359 operates digitally and allows the deserializer to have fewer critical analog circuits which can improve manufacturing and simplify moving a design to new process technology. Additionally, the calibration module 359 can provide fast startup by saving the digital control values and reloading the values on startup.

Figure 4:
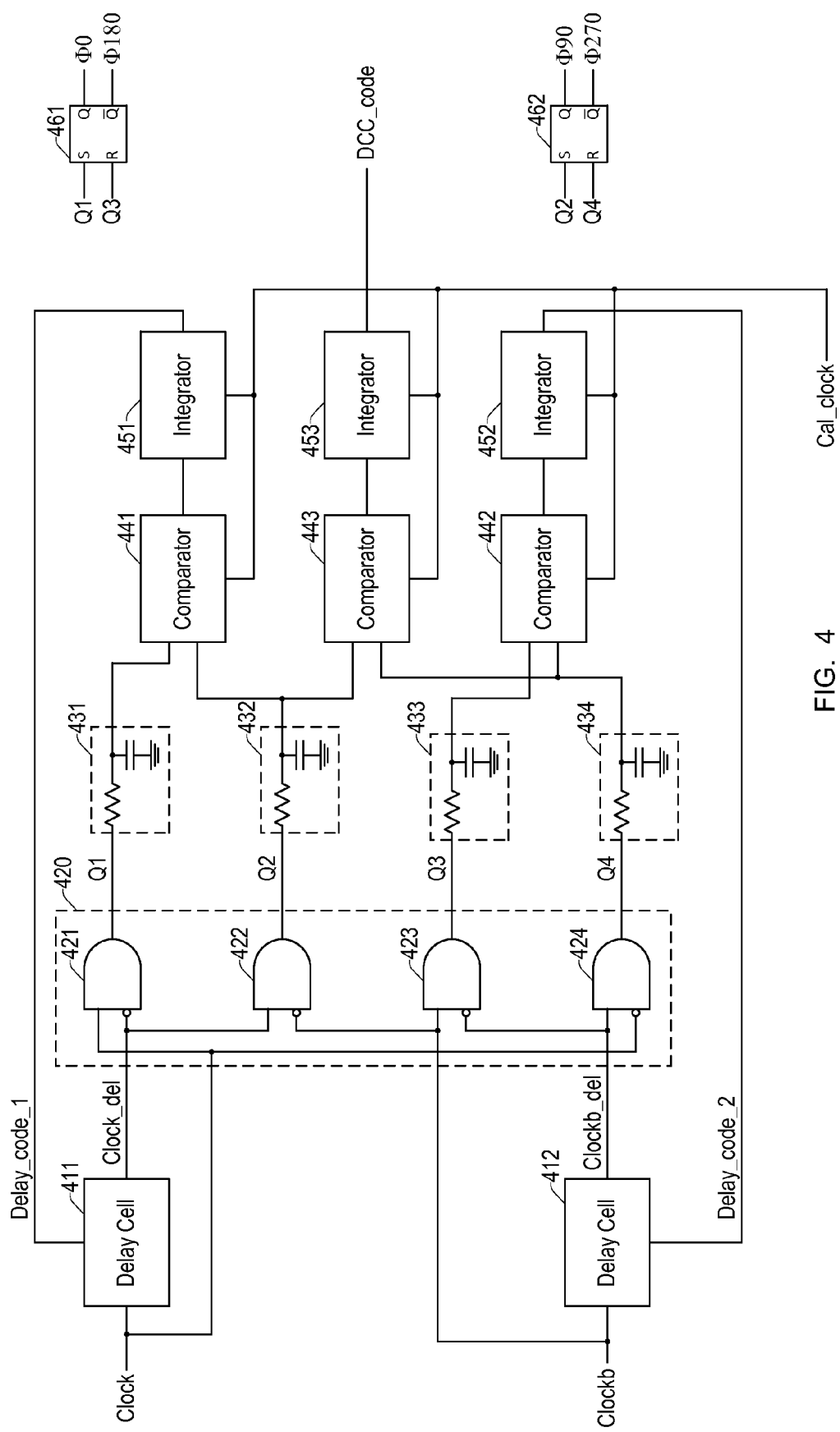
FIG. 4 is functional block diagram of a circuit that can be used to implement the delay-locked loop module and calibration module of the deserializer of FIG. 3 according to a presently disclosed embodiment.

FIG. 4 is functional block diagram of a circuit that can be used to implement the DLL module and calibration module of the deserializer of FIG. 3 according to a presently disclosed embodiment. The circuit receives the pair of differential CMOS clock signals (a positive clock signal "Clock" and a negative clock signal "Clockb") from the CML to CMOS converter 325. The positive clock signal is delayed by a first delay cell 411 to produce a delayed positive clock signal "Clock_del." The negative clock signal is delayed by a second delay cell 412 to produce a delayed negative clock signal "Clockb_del. The delays of the delay cells are adjusted by the calibration module to have delays of one-quarter of the clock period.

Logic circuitry 420 logically combines the positive clock signal, the negative clock signal, the delayed positive clock signal, and the delayed negative clock signal to produce four quarter clock signals. The positive clock signal is ANDed with the complement of the delayed positive clock signal by a first AND gate 421 to produce a first quarter clock signal "Q1." The delayed positive clock signal is ANDed with the complement of the negative clock signal by a second AND gate 422 to produce a second quarter clock signal "Q2." The negative clock signal is ANDed with the complement of the delayed negative clock signal by a third AND gate 423 to produce a third quarter clock signal "Q3." The delayed negative clock signal is ANDed with the complement of the positive clock signal by a fourth AND gate 424 to produce a fourth quarter clock signal "Q4."

The quarter clock signals are high (active) for one-quarter of the clock period and low for the remainder of the clock period. The first quarter clock signal is high for a first one-quarter of the clock period. The second quarter clock signal is delayed from the first quarter clock signal by one-quarter of the clock period. The third quarter clock signal is delayed from the second quarter clock signal by one-quarter of the clock period. The fourth quarter clock signal is delayed from the third quarter clock signal by one-quarter of the clock period. These timing relationships are after calibration, and small errors (e.g., 1%) may exist in the timing relationships.

Two set-reset latches produce the 0, 90, 180, and 270 degree clock signals based on the quarter clock signals. The first set-reset latch 461 has its set input (S) connected to and is set by the first quarter clock signal and has its reset input (R) connected to and is reset by the third quarter clock signal. The true output (Q) of first set-reset latch 461 provides the 0 degree clock signal and the complement output (Q) provides the 180 degree clock signal. The second set-reset latch 462 has its set input (S) connected to and is set by the second quarter clock signal and has its reset input (R) connected to and is reset by the fourth quarter clock signal. The true output (Q) of second set-reset latch 462 provides the 90 degree clock signal and the complement output (Q) provides the 270 degree clock signal. The set-reset latches have small delays and mismatches in the delays will also be small. Thus, calibration of the quarter clock signals will result in accurate calibration of the 0, 90, 180, and 270 degree clock signals.

Figure 5:
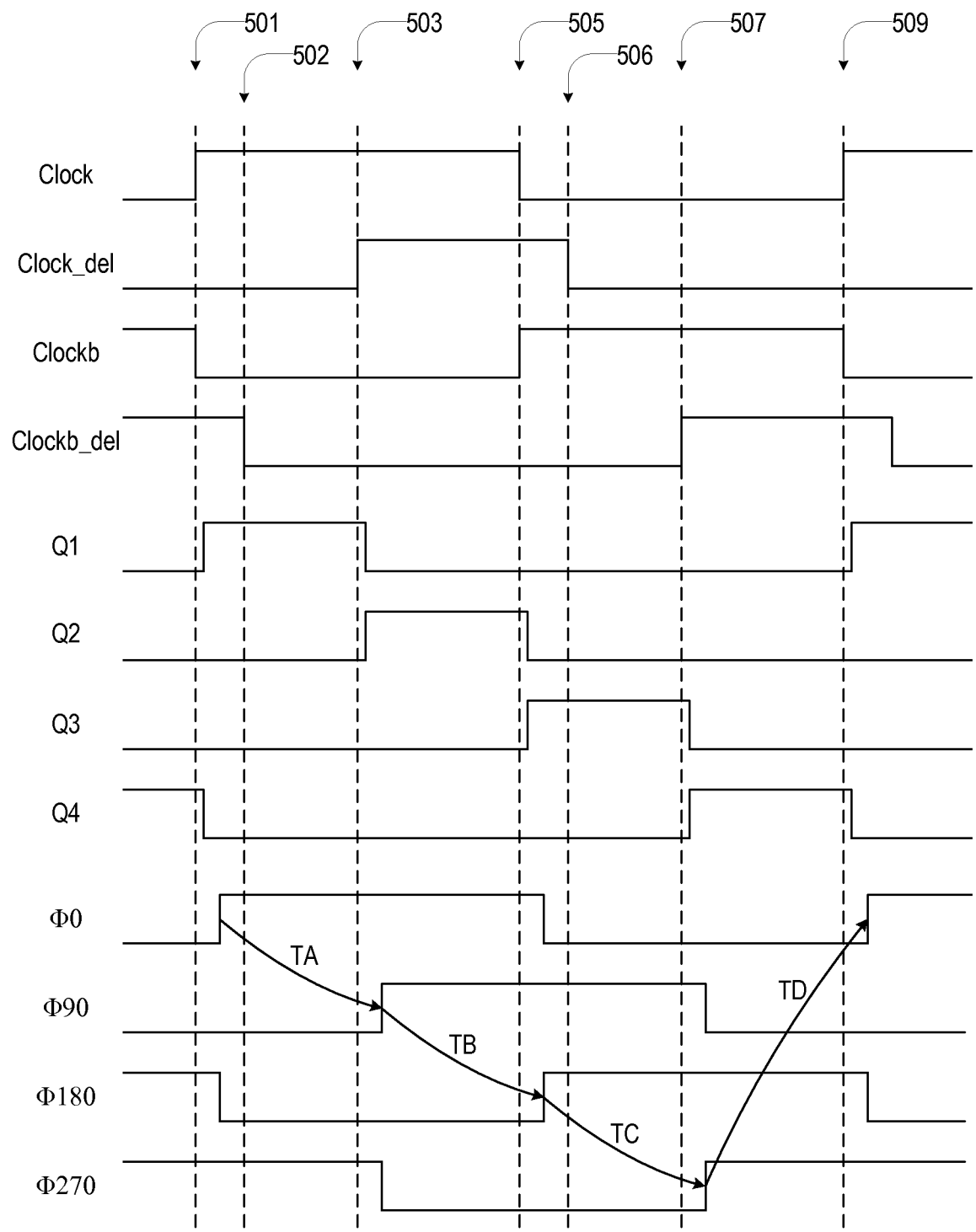
FIG. 5 is a waveform diagram illustrating operation of the circuit of FIG. 4.

FIG. 5 is a waveform diagram illustrating operation of the circuit of FIG. 4. At time 501, the positive clock signal rises and the negative clock signal falls. Shortly after time 501, the first quarter clock signal rises and the fourth quarter clock signal falls. Shortly thereafter, the 0 degree clock signal rises and the 180 degree clock signal falls based on the first set-reset latch 461 being set by the first quarter clock signal. The delay from transition of the positive clock signal to transition of first quarter clock signal and the second quarter clock signal is for switching of the logic circuitry 420. The delay from transition of the first quarter clock signal to transitions of the 0 and 180 degree clock signals is for the switching of the first set-reset latch 461.

At time 502, the delayed negative clock signal falls. The delay between the fall of the negative clock signal and the fall of the delayed negative clock signal is a delay of the second delay cell 412. Since the fall of the delayed negative clock signal does not cause transitions of the 0, 90, 180 or 270 degree clock signals, this delay is not critical to performance of the circuit.

At time 503, the delayed positive clock signal rises. The delay between the rise of the positive clock signal and the rise of the delayed positive clock signal is the controlled delay of the first delay cell 411. Shortly after time 503, the first quarter clock signal falls and the second quarter clock signal rises. Shortly thereafter, the 90 degree clock signal rises and the 270 degree clock signal falls based on the second set-reset latch 462 being set by the second quarter clock signal. The delay from transition of the delayed positive clock signal to transitions of first quarter clock signal and the second quarter clock signal is for switching of the logic circuitry 420. The delay from transition of the second quarter clock signal to transitions of the 90 and 270 degree clock signals is for switching of the second set-reset latch 462.

At time 505, the positive clock signal falls and the negative clock signal rises. Shortly after time 505, the second quarter clock signal falls and the third quarter clock signal rises. Shortly thereafter, the 0 degree clock signal falls and the 180 degree clock signal rises based on the first set-reset latch 461 being reset by the third quarter clock signal. The delay from transition of the negative clock signal to transition of second quarter clock signal and the third quarter clock signal is for switching of the logic circuitry 420. The delay from transition of the third quarter clock signal to transitions of the 0 and 180 degree clock signals is for the switching of the first set-reset latch 461.

At time 506, the delayed positive clock signal falls. The delay between the fall of the positive clock signal and the fall of the delayed positive clock signal is a delay of the first delay cell 411. Since the fall of the delayed positive clock signal does not cause transitions of the 0, 90, 180 or 270 degree clock signals, this delay is not critical to performance of the circuit.

At time 507, the delayed negative clock signal rises. The delay between the rise of the negative clock signal and the rise of the delayed negative clock signal is the controlled delay of the second delay cell 412. Shortly after time 507, the third quarter clock signal falls and the fourth quarter clock signal rises. Shortly thereafter, the 90 degree clock signal falls and the 270 degree clock signal rises based on the second set-reset latch 462 being reset by the fourth quarter clock signal. The delay from transition of the delayed negative clock signal to transitions of third quarter clock signal and the fourth quarter clock signal is for switching of the logic circuitry 420. The delay from transition of the fourth quarter clock signal to transitions of the 90 and 270 degree clock signals is for the switching of the second set-reset latch 462.

At time 509, the positive clock signal again rises and the negative clock signal again falls. Another clock period begins and the transitions described for time 501 repeat.

The time delay from the 0 degree clock signal to the 90 degree clock signal is referred to as distance A (TA); the time delay from the 90 degree clock signal to the 180 degree clock signal is referred to as distance B (TB); the time delay from the 180 degree clock signal to the 270 degree clock signal is referred to as distance C (TC); and the time delay from the 270 degree clock signal to the 0 degree clock signal (of the next clock period) is referred to as distance D (TD).

Returning to FIG. 4, three control loops using three comparators and three integrators provide calibration of the clock phase signals. The control loops use low-pass filtered versions of the quarter clock signals. A first low-pass filter 431 filters the first quarter clock signal; a second low-pass filter 432 filters the second quarter clock signal; a third low-pass filter 433 filters the third quarter clock signal; and a fourth low-pass filter 434 filters the fourth quarter clock signal. The low-pass filters in the embodiment of FIG. 4 use resistor-capacitor (RC) filters. The low-pass filtered quarter clock signals will be about one fourth of the power supply voltage; for example, with a 1 V supply, the low-pass filtered signals will be about 250 mV.

A first control loop adjusts the delay of the first delay cell 411. The first control loop includes a first comparator 441 and a first integrator 451. The first comparator 441 compares the low-pass filtered first quarter clock signal with the low-pass filtered second quarter clock signal. The low-pass filtered first quarter clock signal is proportional to timing distance A (TA in FIG. 5). The low-pass filtered second quarter clock signal is proportional to timing distance B (TB in FIG. 5). The result from the first comparator 441 indicates whether the low-pass filtered first quarter clock signal is greater than the low-pass filtered second quarter clock signal, which indicates whether timing distance A is greater than timing distance B.

The first integrator 451 interprets the comparison signal from the first comparator 441 as a signed error signal (e.g., +1, −1) and integrates the error signal to produce a delay control Delay_code_1 for the first delay cell 411. Since the first delay cell 411 adjusts when the first quarter clock signal ends and the second quarter clock signal begins, the first control loop through the first comparator 441, the first integrator 451, and the first delay cell 411 adjusts the delay to make timing distance A and timing distance B equal.

A second control loop adjusts the delay of the second delay cell 412. The second control loop includes a second comparator 442 and a second integrator 452. The second comparator 442 compares the low-pass filtered third quarter clock signal with the low-pass filtered fourth quarter clock signal. The low-pass filtered third quarter clock signal is proportional to timing distance C (TC in FIG. 5). The low-pass filtered fourth quarter clock signal is proportional to timing distance D (TD in FIG. 5). The result from the second comparator 442 indicates whether the low-pass filtered third quarter clock signal is greater than the low-pass filtered fourth quarter clock signal, which indicates whether timing distance C is greater than timing distance D.

The second integrator 452 interprets the comparison signal from the second comparator 442 as a signed error signal and integrates the error signal to produce a delay control Delay_code_2 for the second delay cell 412 Since the second delay cell 412 adjusts when the third quarter clock signal ends and the fourth quarter clock signal begins, the second control loop through the second comparator 442, the second integrator 452, and the second delay cell 412 adjusts the delay to make timing distance C and timing distance D equal.

A third control loop adjusts the DCC of the CML to CMOS converter 325. The third control loop includes a third comparator 443 and a third integrator 453. The third comparator 443 compares the low-pass filtered second quarter clock signal with the low-pass filtered fourth quarter clock signal. The low-pass filtered second quarter clock signal is proportional to timing distance B (TB in FIG. 5). The low-pass filtered fourth quarter clock signal is proportional to timing distance D (TD in FIG. 5). The result from the third comparator 443 indicates whether the low-pass filtered second quarter clock signal is greater than the low-pass filtered fourth quarter clock signal, which indicates whether timing distance B is greater than timing distance D.

The third integrator 453 interprets the comparison signal from the third comparator 443 as a signed error signal and integrates the error signal to produce a DCC control signal (DCC_code) to adjust the duty cycle of the differential pair of CMOS clock signals (Clock, Clockb) from the CML to CMOS converter 325. Since the DCC control of the CML to CMOS converter 325 adjusts when the third quarter clock signal begins (when the second quarter clock signal ends) and when the first quarter clock signal begins (when the fourth quarter clock signal ends), the third control loop through the third comparator 443, the third integrator 453, and the CML to CMOS converter 325 adjusts the duty cycle to make timing distance B and timing distance D equal.

The first control loop works to make timing distance A equal timing distance B; the second control loop works to make timing distance C equal timing distance D; and the third control loop works to make timing distance B equal timing distance D. By transitive equality, the control loops combine to make all of the timing distances equal. Since the sum of the four timing distances equals one clock period, each of the timing distances equals one-quarter clock period. Thus, the four clock signals will have relative phases of 90 degrees.

The comparators 431, 432, 433 are clocked by a calibration clock signal Cal_clock. The comparators compare their respective input signals on each cycle of the calibration clock signal. The integrators 451, 452, 453 are also clocked by the calibration clock signal. The integrators integrate the error signals from the comparators and can update their respective control outputs on each cycle of the calibration clock signal. The calibration clock signal may be, for example, a 19.2 MHz signal in a deserializer that receives a 10 GHz data rate. Other frequencies may also be used. Since the calibration works to track effects, such as temperature, that change slowly, the rate at which the calibration is performed does not need to be high. Additionally, the calibration clock signal can be asynchronous to the differential pair of CML clock signals (and the other clock signals).

The CML to CMOS converter 325 and the DLL and digital calibration loop modules provided by the circuit of FIG. 4 can generate four clock phase signals with accurate timing relationships from a differential pair of input clock signals. In addition to use in a deserializer, the same or similar circuits may be used in other applications, for example, in a serializer or in a time interleaved analog-to-digital converter.

Figure 6:
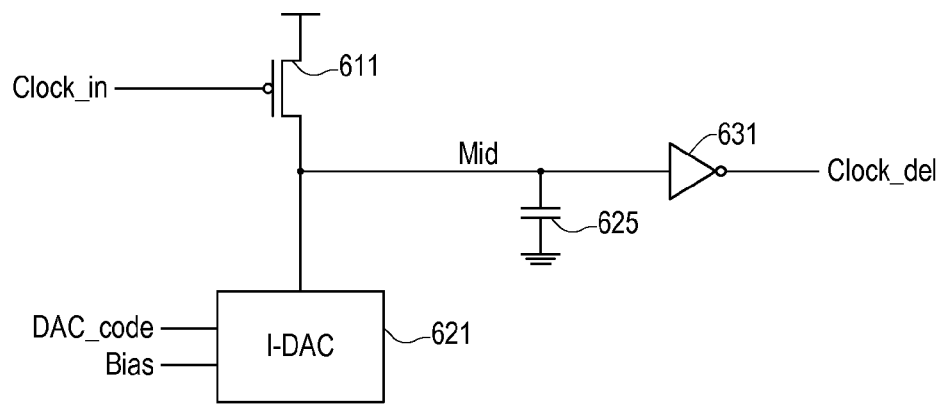
FIG. 6 is a schematic diagram of a delay cell according to a presently disclosed embodiment.

FIG. 6 is a schematic diagram of a delay cell according to a presently disclosed embodiment. The delay cell may be used as the delay cells 411, 412 of the circuit of FIG. 4. The delay cell uses a single delay stage of controlled capacitor charging and discharging to produce its delay. The delay stage includes an inverter 631 that drives the output Clock_del of the delay cell.

The input Clock_in of the delay cell is connected to the gate of a p-channel transistor 611. The p-channel transistor 611 can function as a switch and may be termed a switch. The source of the p-channel transistor 611 is connected to a voltage supply and the drain of the p-channel transistor 611 is connected to a midpoint Mid of the delay cell. The midpoint is connected to the input of the inverter 631. A current-mode digital-to-analog converter 621 sinks current from the midpoint of the delay cell. A capacitor 625 may also be included in the delay cell. In some embodiments, the capacitor is provided by capacitance (which may be termed parasitic capacitance) of other elements of the delay cell (e.g., input capacitance of the inverter 631, source capacitance of the p-channel transistor 611, output capacitance of the current-mode DAC 621, and capacitance of the wiring of the midpoint node).

Figure 7:
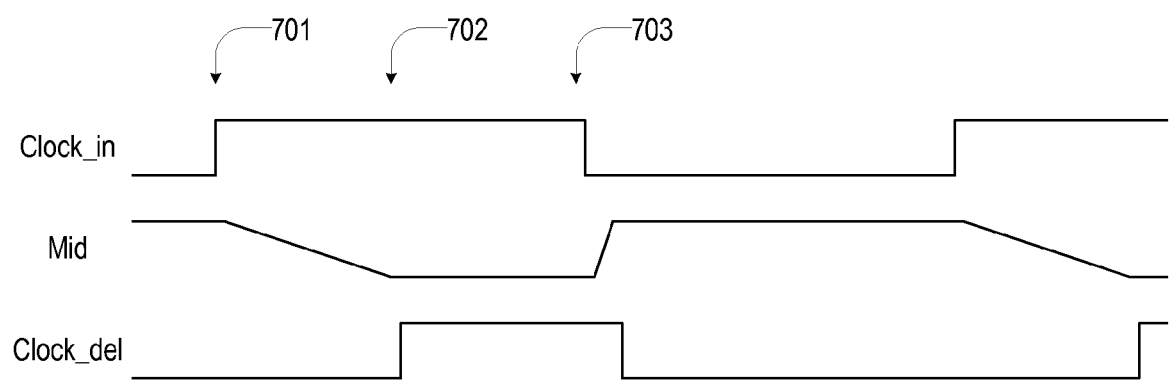
FIG. 7 is a waveform diagram illustrating operation of the delay cell of FIG. 6.

FIG. 7 is a waveform diagram illustrating operation of the delay cell of FIG. 6. When the input to the delay cell switches high (time 701), the p-channel transistor 611 turns off and the current-mode DAC 621 pulls the midpoint low. When the midpoint has discharged below the threshold of the inverter 631 (time 702), the output switches high.

The delay in discharging the midpoint will vary depending on the current sunk by the current-mode DAC 621 and the capacitance on the midpoint. The delay through the delay cell for a low-to-high transition accordingly is proportional to the current sunk by the DAC. The current of the current-mode DAC 621 is set by a delay control signal DAC_code. The current-mode DAC 621 also receives a bias current signal (Bias) that provides a reference current or voltage. In the DLL module of FIG. 4, the DAC current for the first delay cell 411 is set by the delay control signal from the first integrator 451 and the DAC current for the second delay cell 412 is set by the delay control signal from the second integrator 452. In a deserializer that operates at a 10 Gbps data rate, the DAC current may be set so that one LSB of change in the delay control signal causes approximately 1 ps change in delay.

When the input to the delay cell switches low (time 703), the p-channel transistor 611 turns on and pulls the midpoint high. The midpoint may switch high rapidly due to the current from the p-channel transistor 611. The midpoint switching high causes the inverter 631 to switch the output of the delay cell low. The delay through the delay cell may be accordingly small for a high-to-low transition.

The delay cell of FIG. 6 can have asymmetric (unequal) delays for rising transitions and falling transitions. In particular, the delay for falling transitions depends largely on the current of the p-channel transistor 611 and the delay for rising transitions depends largely on the current of the current-mode DAC 621. In the circuit of FIG. 4, the delay of the delay cells 411, 412 for falling transitions is not critical. The delays of the delay cells for rising transitions, which is controlled by the DAC current, are the delays used in adjusting the timing of the clock phase signals.

Figure 8:
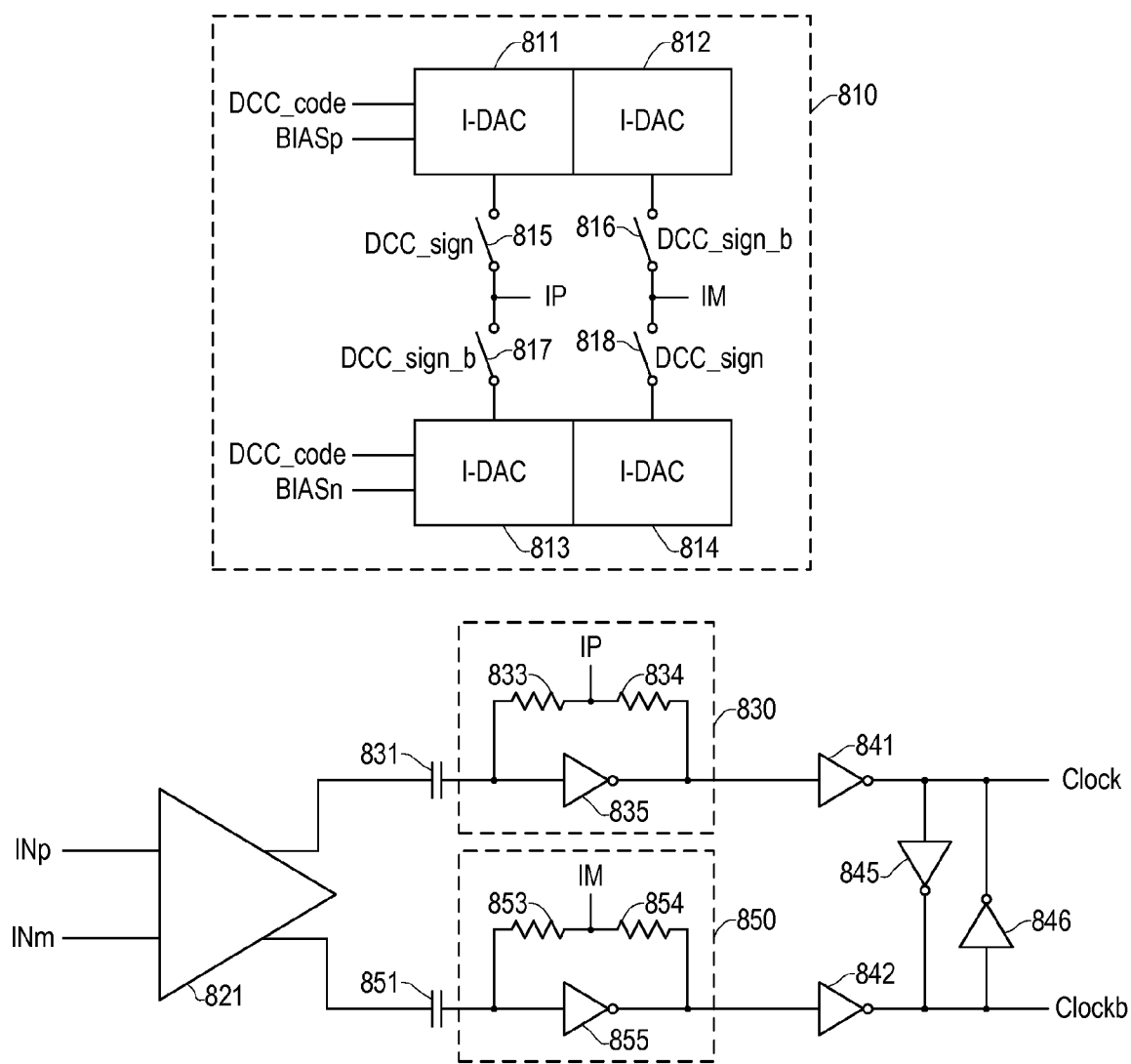
FIG. 8 is a schematic diagram of a CML to CMOS converter according to a presently disclosed embodiment.

FIG. 8 is a schematic diagram of a CML to CMOS converter according to a presently disclosed embodiment. The CML to CMOS converter may be used as the CML to CMOS converter 325 in the deserializer of FIG. 3. The CML to CMOS converter of FIG. 8 includes a duty cycle correction function. The duty cycle correction function is controlled by a DCC control signal. The DCC control signal in the CML to CMOS converter of FIG. 8 uses a sign-magnitude representation. A DCC sign signal (DCC_sign and its complement DCC_sign_b) controls the direction of the duty cycle correction and a DCC magnitude signal DCC_code controls the amount of duty cycle correction. The DCC magnitude signal may be the magnitude of the integrated error signal from the third integrator 453 of the calibration module of FIG. 4 with the DCC sign signal being the sign of the integrated error signal. Similarly, when the CML to CMOS converter of FIG. 8 is used as the CML to CMOS converter 325 in the deserializer of FIG. 3, the DCC control signal is the DCC control signal (DCC_code).

The CML to CMOS converter receives a pair of differential CML input signals (a positive input signal INp and a negative input signal INm). When the CML to CMOS converter of FIG. 8 is used as the CML to CMOS converter 325 in the deserializer of FIG. 3, the differential CML input signals are received from the phase interpolator 321. The input signals may be amplified in a preamplifier 821. The outputs of the preamplifier 821 are capacitively coupled (AC coupled) to self-biased amplifiers 830, 850 by capacitors 831, 851. The self-biased amplifiers 830, 850 have adjustable DC points. Adjusting the DC points of the self-biased amplifiers 830, 850 effectively changes the threshold levels and thereby changes the duty cycle of the CML to CMOS converter.

The outputs of the self-biased amplifiers 830, 850 are buffered by inverters to drive the output signals (the differential pair of CMOS clock signals Clock, Clockb) of the CML to CMOS converter. When the CML to CMOS converter of FIG. 8 is used as the CML to CMOS converter 325 in the deserializer of FIG. 3, the output signals are the differential pair of CMOS clock signals (100 0, φ180), which are supplied to the DLL module 355. Inverter 841 drives the positive signal of the differential pair of CMOS clock signals from the output of the first self-biased amplifier 830. Inverter 842 drives the negative signal of the differential pair of CMOS clock signals from the output of the second self-biased amplifier 850. The CML to CMOS converter may include inverter 845 and inverter 846 that are cross-coupled between the positive signal and the negative signal of the differential pair of CMOS clock signals.

The first self-biased amplifier 830 includes a first inverter 835; the second self-biased amplifier 850 includes a second inverter 855. Two series resistors 833, 834 are coupled from input to output of the first inverter 835; two series resistors 853, 854 are coupled from input to output of the second inverter 855. Currents are supplied to or sunk from the midpoint of the series resistors to adjust the DC points and threshold levels.

A biasing module 810 adjusts the threshold levels of the self-biased amplifiers 830, 850. The biasing module 810 includes two current-mode DACs 811, 812 that can source currents. The biasing module 810 includes two current-mode DACs 813, 814 that can sink currents. Alternatively, a single DAC or combined DAC with multiple outputs may be used.

In the illustrated embodiment, current-mode DACs 811, 812 are biased by a p-bias signal BIASp and current-mode DACs 813, 814 are biased by an n-bias signal BIASn. The bias signals may be a voltage or current references. The level of the currents sourced or sunk by the DACs is controlled by the DCC magnitude signal.

The biasing module 810 includes four switches to selectively couple the current-mode DACs to the self-biased amplifiers 830, 850. A first switch 815 couples current-mode DAC 811 to the first self-biased amplifier 830 when the DCC sign signal is positive; a second switch 816 couples current-mode DAC 812 to the second self-biased amplifier 850 when the DCC sign signal is negative; a third switch 817 couples current-mode DAC 813 to the first self-biased amplifier 830 when the DCC sign signal is negative; and a fourth switch 818 couples current-mode DAC 814 to the second self-biased amplifier 850 when the DCC sign signal is positive. The first switch 815 and the second switch 816 may be implemented, for example, with p-channel transistors; the third switch 817 and the fourth switch 818 may be implemented, for example, with n-channel transistors.

When the biasing module 810 supplies current to the first self-biased amplifier 830 to increase its threshold, the biasing module 810 also sinks current from the second self-biased amplifier 850 to decrease its threshold. This increases the duty cycle of the output signals of the CML to CMOS converter. When the biasing module 810 sinks current from the first self-biased amplifier 830 to decrease its threshold, the biasing module 810 also supplies current to the second self-biased amplifier 850 to increase its threshold. This decreases the duty cycle of the output signals of the CML to CMOS converter.

Figure 9:
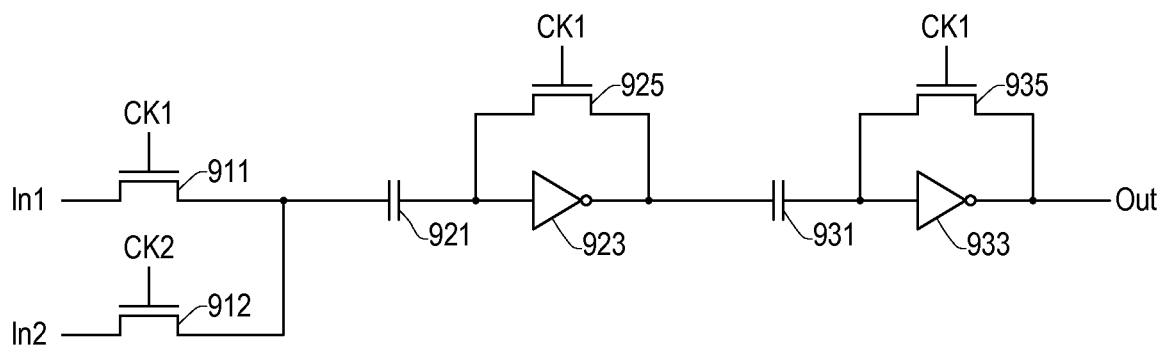
FIG. 9 is a schematic diagram of a comparator according to a presently disclosed embodiment.

FIG. 9 is a schematic diagram of a comparator according to a presently disclosed embodiment. The comparator may be used as the comparators 441, 442, 443 in the circuit of FIG. 4. The comparator of FIG. 9 is a switched-capacitor type comparator with auto-zeroing. Other types of comparators may also be used. The comparator receives two input signals In1 and In2 that it compares. The comparator produces an output signal Out that indicates which of the input signals was greater. The comparator is clocked by two clock phase signals CK1, CK2. The two clock phase signals are non-overlapping. The comparator uses cascaded inverter stages to increase its gain.

During a reset phase, the input and output of a first inverter 923 are connected by switch 925 and the input and output of a second inverter 933 are connected by switch 935. Additionally, switch 911 connects the first input signal to a first terminal of a first capacitor 921 whose second terminal is connected to the input of the first inverter 923. A second capacitor 931 is connected between the output of the first inverter 923 and the input of the second inverter 933. The reset phase charges the first capacitor 921 and the second capacitor 931 to zero offset error voltages.

During a comparison phase, switch 925, switch 935, and switch 911 are disabled and switch 912 connects the second input to the first terminal of the first capacitor 921. When the second input signal is greater than the first input signal, the voltage on the first node of the first capacitor 921 will increase during the comparison phase. This causes, through the first capacitor 921, an increase in the voltage on the input of the first inverter 923 which is amplified and causes a larger decrease in the voltage on the output of the first inverter 923. This causes, through the second capacitor 931, a decrease in the voltage on the input of the second inverter 933 which is amplified and causes a still larger increase in the voltage on the output (the output of the comparator) of the second inverter 933. A similar but complementary operation occurs when the second input signal is less than the first input signal.

The switches 911, 912, 925, 935 may be implemented, for example, with n-channel transistors. The switches may also be implemented with p-channel transistors or complementary pairs of transistors.

The comparator of FIG. 9 can achieve good accuracy with small integrated circuit area and low power consumption. For example, the comparator can achieve a sensitivity of approximately 2.5 mV. For a 10 GHz deserializer, 2.5 mV corresponds to approximately 1 ps variation in the clock signals.

Figure 10:
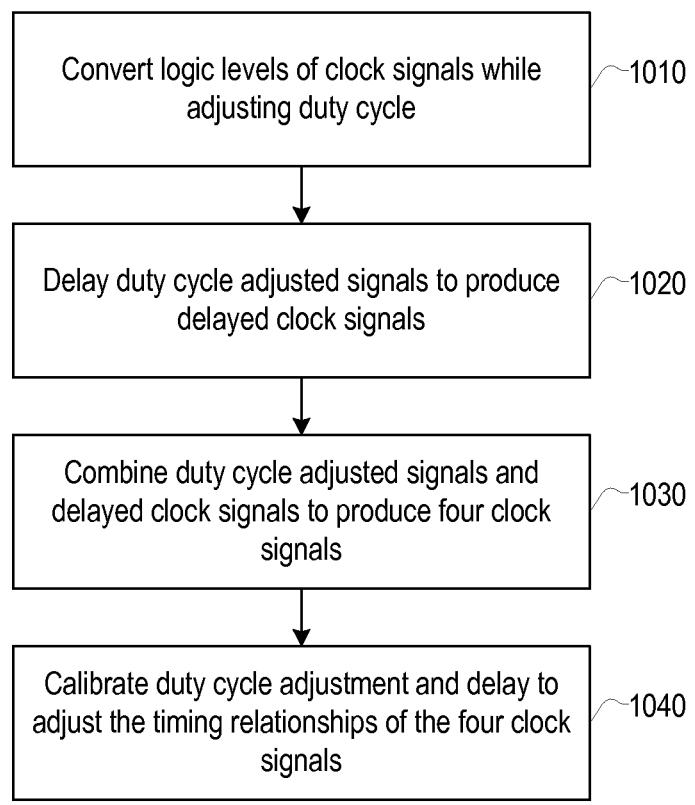
FIG. 10 is a flow chart of a process for generating four clock signals with accurate timing relationships according to a presently disclosed embodiment.

FIG. 10 is a flow chart of a process for generating four clock signals with accurate timing relationships according to a presently disclosed embodiment. The process may be implemented, for example, using the deserializer of FIG. 3, the circuit of FIG. 4, the delay cell of FIG. 6, the CML to CMOS converter of FIG. 8, and the comparator of FIG. 9.

In step 1010, the process converts logic levels of input clock signals while adjusting the duty cycle of the converted clock signals. The CML to CMOS converter of FIG. 8 may, for example, be used for step 1010 to convert a differential pair of CML clock signals to a differential pair of CMOS clock signals with corrected duty cycle.

In step 1020, the process delays the converted clock signals to produce delayed clock signals. Two of the delay cells of FIG. 6 may be used, for example, to perform step 1020.

In step 1030, the process produces the four clock signals based on the converted clock signals and the delayed clock signals. The logic circuitry 420 and the set-reset latches 461, 462 of FIG. 4 may, for example, be used to produce the quarter clock signals based on the differential pair of CMOS clock signals and the delayed positive and negative clock signals and then produce the 0, 90, 180, and 270 degree clock signals based on the quarter clock signals.

In step 1040, the process calibrates the timing relationships of the four clock signals by adjusting the duty cycle of step 1020 and the delays of step 1030. The three control loops of FIG. 4 may, for example, be used to control the delay of the first delay cell 411, the delay of the second delay cell 412, and the DCC of the CML to CMOS converter 325.

The process of FIG. 10 may be modified, for example, by adding or altering steps. For example, an interpolating step may interpolate the input clock signals from in-phase and quadrature clock signals. Additionally, steps may be performed concurrently.

Although embodiments of the invention are described above for particular embodiments, many variations of the invention are possible, including, for example, those with different signal polarities and transistor types. Additionally, technologies and signal levels other than CML and CMOS may be used. Some functions may be deleted; for example, the CML to CMOS converter may, in an embodiment, just adjust duty cycle without level conversion. Furthermore, functions described as being performed by one module may be moved to another module or distributed across modules. Other variations may produce a different number of clock signals, for example, eight clock signals spaced by 45 degrees. Additionally, features of the various embodiments may be combined in combinations that differ from those described above.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A circuit for generating four clock signals with accurate timing relationships, the circuit including:
   a current-mode logic (CML) to CMOS converter configured to convert a differential pair of CML clock signals to a differential pair of CMOS clock signals, wherein the CML to CMOS converter includes a duty cycle correction function that controls the duty cycle of the differential pair of CMOS clock signals;
   a delay-locked loop module including
      a first delay cell configured to produce a delayed positive clock signal from a positive signal of the differential pair of CMOS clock signals, and
      a second delay cell configured to produce a delayed negative clock signal from a negative signal of the differential pair of CMOS clock signals, and
   configured to produce the four clock signals from the differential pair of CMOS clock signals, the delayed positive clock signal, and the delayed negative clock signal; and a calibration module configured to control a delay of the first delay cell, control a delay of the second delay cell, and control the duty cycle correction function of the CML to CMOS converter to adjust the timing relationships of the four clock signals.

2. The circuit of claim 1, wherein the delay-locked loop module further includes:
   logic circuitry configured to combine the differential pair of CMOS clock signals, the delayed positive clock signal, and the delayed negative clock signal to produce four quarter clock signals having active times of one-quarter clock period; and
   set-reset latches configured to produce the four clock signals from the quarter clock signals.

3. The circuit of claim 2, wherein the logic circuitry comprises:
   a first AND gate having inputs coupled to the positive signal of the differential pair of CMOS clock signals and the complement of the delayed positive clock signal and an output coupled to a first one of the quarter clock signals;
   a second AND gate having inputs coupled to the complement of the negative signal of the differential pair of CMOS clock signals and the delayed positive clock signal and an output coupled to a second one of the quarter clock signals;
   a third AND gate having inputs coupled to the negative signal of the differential pair of CMOS clock signals and the complement of the delayed negative clock signal and an output coupled to a third one of the quarter clock signals; and
   a fourth AND gate having inputs coupled to the complement of the positive signal of the differential pair of CMOS clock signals and the delayed negative clock signal and an output coupled to a fourth one of the quarter clock signals.

4. The circuit of claim 3, wherein the set-reset latches comprise:
   a first set-reset latch having a set input coupled to the first one of the quarter clock signals and a reset input coupled to the third one of the quarter clock signals and having a true output coupled a first one of the four clock signals and a complement output coupled to a third one of the four clock signals; and
   a second set-reset latch having a set input coupled to the third one of the quarter clock signals and a reset input coupled to the fourth one of the quarter clock signals and having a true output coupled a second one of the four clock signals and a complement output coupled to a fourth one of the four clock signals.

5. The circuit of claim 2, wherein the first delay cell and the second delay cell have asymmetric delays for rising and falling transitions.

6. The circuit of claim 1, wherein each of the first delay cell and the second delay cell consists of a single delay stage.

7. The circuit of claim 6, wherein the delay stage includes:
   a p-channel transistor having a gate coupled to a signal of the differential pair of CMOS clock signals, a source coupled to a voltage supply, and a drain coupled to a midpoint of the delay stage;
   a current-mode digital-to-analog converter coupled to the midpoint of the delay stage, wherein a current of the current-mode digital-to-analog converter controls a delay of the delay stage; and
   an inverter having an input coupled to the midpoint of the delay stage and an output coupled to a respective one of the delayed clock signals.

8. The circuit of claim 2, wherein the calibration module includes:
   low-pass filters configured to filter each of the quarter clock signals and produce filtered quarter clock signals;
   comparators configured to compare pairs of the filtered quarter clock signals and produce error signals; and
   integrators configured to integrate the error signals from the comparators to produce control signals to control the delays of the first delay cell and the second delay cell and the duty cycle of the CML to CMOS converter.

9. The circuit of claim 8, wherein each of the low-pass filters includes a resistor-capacitor filter.

10. The circuit of claim 8, wherein
    a first one of the comparators receives a first one of the filtered quarter clock signals and a second one of the filtered quarter clock signals and produces a first one of the error signals;
    a first one of the integrators receives the first one of the error signals and produce the control to the delay of the first delay cell;
    a second one of the comparators receives a third one of the filtered quarter clock signals and a fourth one of the filtered quarter clock signals and produces a second one of the error signals;
    a second one of the integrators receives the second one of the error signals and produce the control to the delay of the second delay cell;
    a third one of the comparators receives the second one of the filtered quarter clock signals and the fourth one of the filtered quarter clock signals and produces a third one of the error signals; and
    a third one of the integrators receives the third one of the error signals and produces the control to the duty cycle correction function of the CML to CMOS converter.

11. The circuit of claim 8, wherein the comparators and the integrators are clocked by a calibration clock signal that is asynchronous to the differential pair of CML clock signals.

12. The circuit of claim 8, wherein the comparators are switched-capacitor comparators.

13. The circuit of claim 1, wherein the CML to CMOS converter includes:
    self-biased amplifiers having inputs capacitively coupled to the differential pair of CML clock signals and outputs coupled to the differential pair of CMOS clock signals, wherein the duty cycle correction function controls threshold levels of the self-biased amplifiers.

14. The circuit of claim 13, wherein each of the self-biased amplifiers includes an inverter and series resistors connected between an input of the inverter and an output of the inverter, and
    wherein the duty cycle correction function controls the threshold levels of the self-biased amplifiers by supplying currents to or sinking currents from midpoints of the series resistors.

15. The circuit of claim 14, further comprising a biasing module comprising a plurality of current-mode digital-to-analog converters coupled to the midpoints of the series resistors by a plurality of switches.

16. The circuit of claim 13, wherein the inputs of the self-biased amplifiers are capacitively coupled to the differential pair of CML clock signals through a preamplifier.

17. The circuit of claim 1, further comprising a phase interpolator configured to produce the differential pair of CML clock signals from a plurality of input clock signals based on a phase control signal.

18. A deserializer comprising:
the circuit of claim 17;
a sampler module configured to sample a serial data signal on edges of the four clock signals; and
a loop filter configured to produce the phase control signal for the phase interpolator based on sample values from the sampler module.

19. A method for generating four clock signals with accurate timing relationships, the method including:
converting logic levels of a differential pair of CML clock signals to a differential pair of CMOS clock signals including adjusting the duty cycle of the differential pair of CMOS clock signals;
delaying a positive signal of the differential pair of CMOS clock signals to produce a delayed positive clock signal;
delaying a negative signal of the differential pair of CMOS clock signals to produce a delayed negative clock signal;
combining the differential pair of CMOS clock signals, the delayed positive clock signal, and the delayed negative clock signal to produce the four clock signals; and
calibrating the adjustment of the duty cycle of the differential pair of CMOS clock signals, the delay of the delayed positive clock signal, and the delay of the delayed negative clock signal to adjust the timing relationships of the four clock signals.

20. The method of claim 19, wherein combining the differential pair of CMOS clock signals, the delayed positive clock signal, and the delayed negative clock signal to produce the four clock signals includes:
logically combining the differential pair of CMOS clock signals, the delayed positive clock signal, and the delayed negative clock signal to produce four quarter clock signals having active times of one-quarter clock period; and
setting and resetting latches to produce the four clock signals based on the quarter clock signals.

21. The method of claim 20, wherein delaying the positive signal of the differential pair of CMOS clock signals to produce the delayed positive clock signal includes using asymmetric delays for rising and falling transitions.

22. The method of claim 20, wherein calibrating the adjustment of the duty cycle of the differential pair of CMOS clock signals, the delay of the delayed positive clock signal, and the delay of the delayed negative clock signal includes:
low-pass filtering each of the quarter clock signals to produce filtered quarter clock signals;
comparing pairs of the filtered quarter clock signals and produce error signals; and
integrating the error signals; and
controlling the duty cycle of the differential pair of CMOS clock signals, the delay of the delayed positive clock signal, and the delay of the delayed negative clock signal based on the integrated error signals.

23. An apparatus for generating four clock signals with accurate timing relationships, the apparatus including:
a means for converting a differential pair of CML clock signals to a differential pair of CMOS clock signals including a duty cycle correction function that controls the duty cycle of the differential pair of CMOS clock signals;
a means for producing the four clock signals from the differential pair of CMOS clock signals including delaying a positive signal of the differential pair of CMOS clock signals to produce a delayed positive clock signal and delaying a negative signal of the differential pair of CMOS clock signals to produce a delayed negative clock signal; and
a means for calibrating the timing relationships of the four clock signals including controlling the delays of delaying each of the differential pair of CMOS clock signals and controlling the duty cycle correction function.

24. The apparatus of claim 23, wherein the means for producing the four clock signals includes:
a first delay cell configured to produce the delayed positive clock signal from the positive signal of the differential pair of CMOS clock signals;
a second delay cell configured to produce the delayed negative clock signal from the negative signal of the differential pair of CMOS clock signals;
logic circuitry configured to combine the differential pair of CMOS clock signals and the delayed clock signals to produce four quarter clock signals having active times of one-quarter clock period; and
set-reset latches configured to produce the four clock signals from the quarter clock signals.

25. The apparatus of claim 24, wherein the first delay cell and the second delay cell have asymmetric delays for rising and falling transitions.

26. The apparatus of claim 24, wherein each of the delay cells consists of a single delay stage.

27. The apparatus of claim 24, wherein the means for calibrating includes:
low-pass filters configured to filter each of the quarter clock signals and produce filtered quarter clock signals;
comparators configured to compare pairs of the filtered quarter clock signals and produce error signals; and
integrators configured to integrate the error signals from the comparators to produce controls to control delays of the delay cells and the duty cycle correction function.

28. The apparatus of claim 23, wherein the means for converting the differential pair of CML clock signals to the differential pair of CMOS clock signals includes:
self-biased amplifiers having inputs capacitively coupled to the differential pair of CML clock signals and outputs coupled to the differential pair of CMOS clock signals, wherein the duty cycle correction function controls threshold levels of the self-biased amplifiers.

29. The apparatus of claim 28, wherein each of the self-biased amplifiers includes an inverter and series resistors connected between an input of the inverter and an output of the inverter, and
wherein the duty cycle correction function controls the threshold levels of the self-biased amplifiers by supplying currents to or sinking currents from midpoints of the series resistors.

30. The apparatus of claim 23, further comprising a means for interpolating from a plurality of input clock signals based on a phase control signal to produce the differential pair of CML clock signals.

\* \* \* \* \*